US006496962B1

(12) United States Patent
Dalton

(10) Patent No.: US 6,496,962 B1
(45) Date of Patent: Dec. 17, 2002

(54) STANDARD LIBRARY GENERATOR FOR CELL TIMING MODEL

(75) Inventor: Kenton Dalton, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 98 days.

(21) Appl. No.: 09/715,814

(22) Filed: Nov. 17, 2000

(51) Int. Cl.[7] .............................................. G06F 17/50
(52) U.S. Cl. ................... 716/6; 716/18; 703/14
(58) Field of Search ........................ 716/1–21; 714/738, 714/726; 707/200; 703/14, 28, 23

(56) References Cited

U.S. PATENT DOCUMENTS

| 5,084,824 | A | * | 1/1992 | Lam et al. | 716/11 |
| 5,831,868 | A | * | 11/1998 | Beausang et al. | 716/18 |
| 6,247,165 | B1 | * | 6/2001 | Wohl et al. | 716/5 |
| 2002/0059553 | A1 | * | 5/2002 | Eng | 716/4 |

* cited by examiner

Primary Examiner—Vuthe Siek
Assistant Examiner—Helen B Rossoshek
(74) Attorney, Agent, or Firm—Fitch, Even, Tabin & Flannery

(57) ABSTRACT

A method of generating a cell function and timing model library in a standard library format includes the steps of (a) receiving as input a model source file, a technology dependent file, and a cell list data file; (b) parsing a functional description for each cell in the cell list data file from the model source file; (c) expanding parameterized timing data for each cell in the cell list data file from the technology dependent file; and (d) generating as output a cell model library in a standard library format from the parameterized timing data.

19 Claims, 3 Drawing Sheets

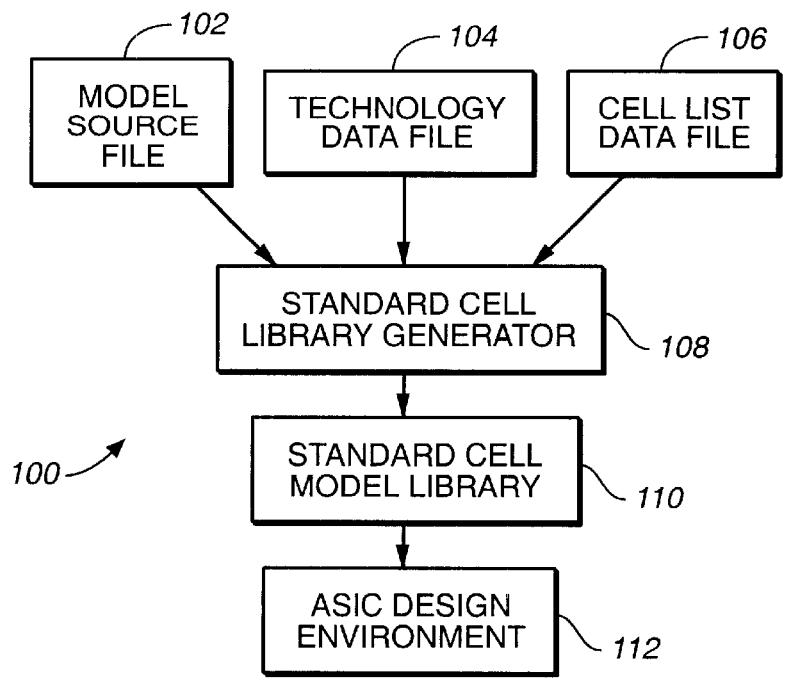
FIG._1
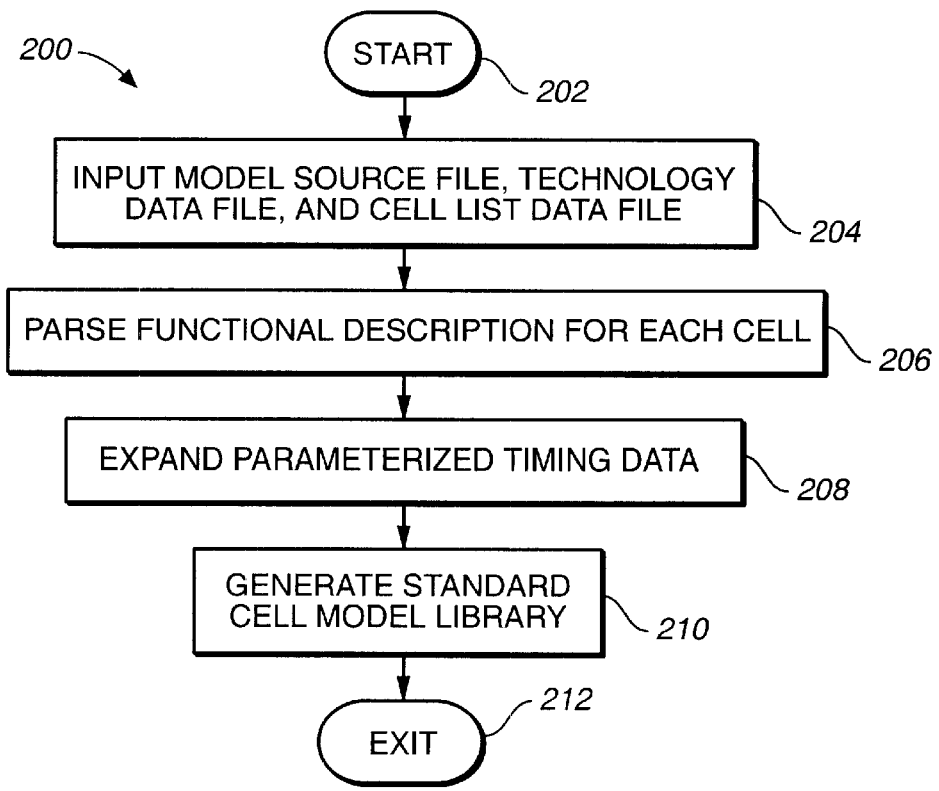
FIG._2

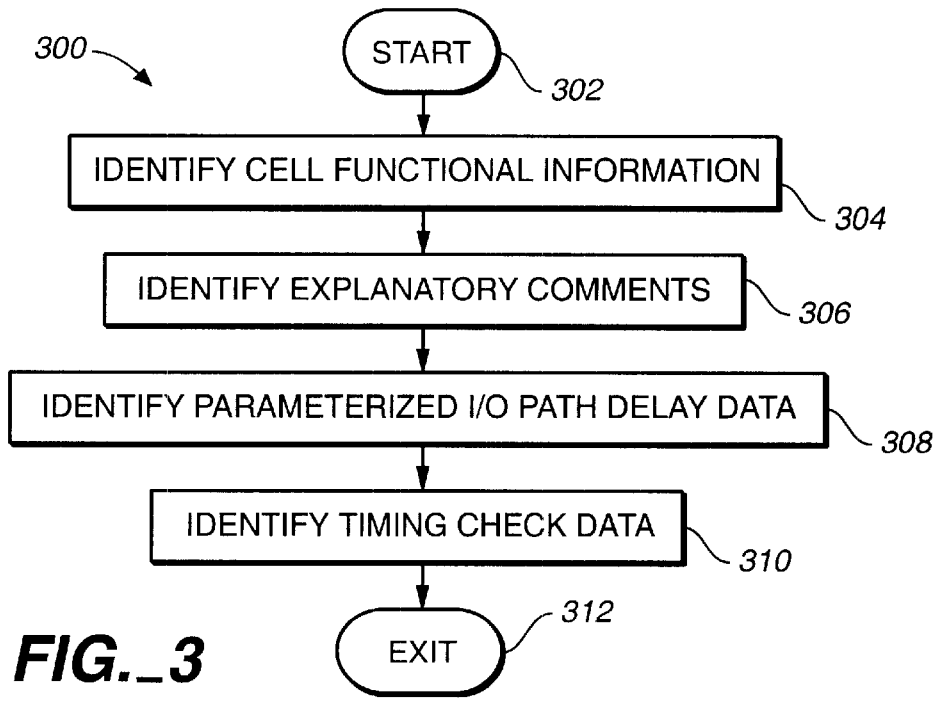
FIG._3
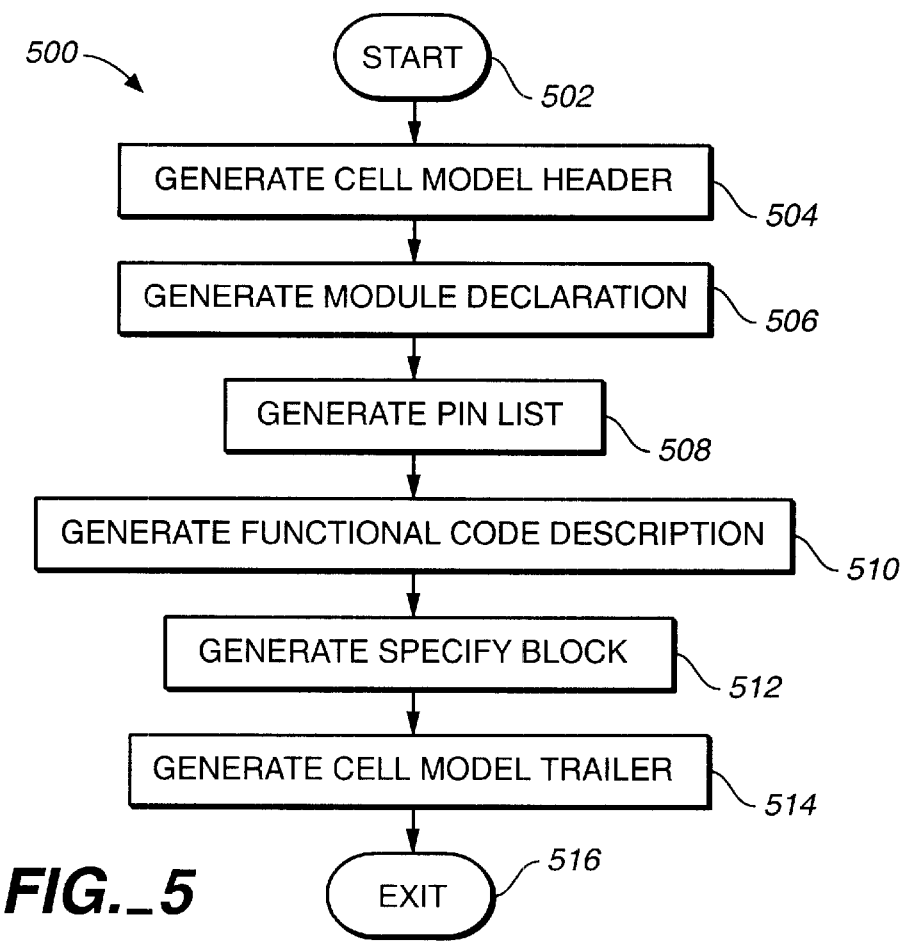
FIG._5

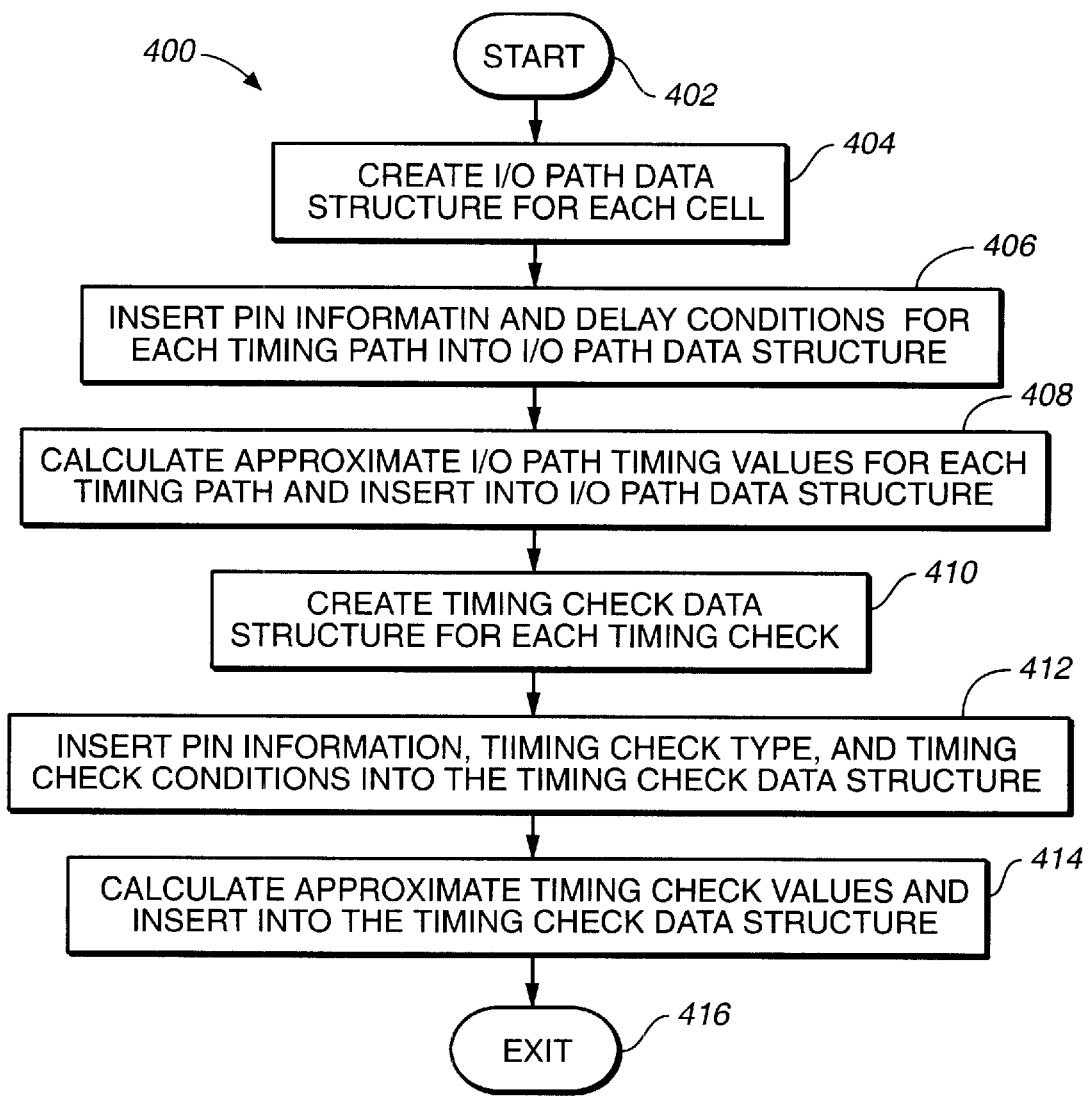
FIG._4

STANDARD LIBRARY GENERATOR FOR CELL TIMING MODEL

COPYRIGHT NOTICE

A portion of the disclosure of this patent application contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

The present invention relates generally to application-specific integrated circuit (ASIC) design. More specifically, but without limitation thereto, the present invention relates to a method for generating a cell function and timing model in a standard library format for a specific technology from a cell design description.

Application-specific integrated circuit (ASIC) design tools are used to simulate a circuit design to detect and solve design problems until the design goals are achieved in theory before committing to the expense of physically manufacturing the ASIC. Current design methods require manually developing a cell timing model for a specific technology in a standard format for third party ASIC design software such as a Verilog model library. To migrate a circuit design to a new technology requires manually updating the Verilog model library. The manual effort required for developing and updating cell timing models is time-consuming and prone to introducing errors.

SUMMARY OF THE INVENTION

The present invention advantageously addresses the problems above as well as other problems by providing a method for automatically generating a standard cell timing model library from a technology-independent functional description.

In one embodiment, the present invention may be characterized as a method of generating a cell function and timing model library in a standard library format that includes the steps of (a) receiving as input a model source file, a technology dependent file, and a cell list data file; (b) parsing a functional description for each cell in the cell list data file from the model source file; (c) expanding parameterized timing data for each cell in the cell list data file from the technology dependent file; and (d) generating as output a standard cell model library from the parameterized timing data.

BRIEF DESCRIPTION OF THE DRAWINGS

The above and other aspects, features and advantages of the present invention will be more apparent from the following more specific description thereof, presented in conjunction with the following drawings wherein:

FIG. 1 is a block diagram of a flowchart for generating a standard library for a cell timing model according to an embodiment of the present invention;

FIG. 2 is a more detailed flowchart of the step of generating a cell library in FIG. 1;

FIG. 3 is a more detailed flowchart of the step of parsing the cell list in FIG. 2;

FIG. 4 is a more detailed flowchart of the step of expanding the parameterized timing data in FIG. 2; and FIG. 5 is a more detailed flowchart of the step of generating as output the standard cell model library in FIG. 2.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

The functionality and the basic circuit design of many cells overlap or are built upon from one technology release to another. A cell is a group of one or more circuit elements such as transistors, capacitors, and other basic circuit elements connected together to perform a function. Cells are provided as part of an ASIC design technology library that defines which cells are implemented in a specific circuit design. The task of developing specific timing models for each cell in each technology may be expedited by utilizing a technology independent, cell functional description file format to describe families of circuits for standard software models, such as Verilog models. The standard software model is used in conjunction with technology dependent cell characterization and timing data by ASIC design tools to create a set of simulation models in the widely supported Verilog hardware description language (HDL). The Verilog models may then be distributed as part of an ASIC design system.

FIG. 1 is a block diagram of a flowchart 100 for generating a standard library for a cell timing model. Shown in FIG. 1 are a model source file 102, a technology data file 104, a cell list data file 106, a standard cell library generator 108, a standard cell model library 110, and an ASIC design environment 112. The ASIC design environment 112 is a collection of design tools, data, and documentation provided to ASIC circuit design engineers for implementing a circuit design using a specific semiconductor technology.

The model source file 102 uses a technology-independent format to define a cell that retains core functionality of cell behavior and content while parameterizing model traits that vary from one technology library to another, such as the cell name and timing characteristics. For example, a basic cell definition may include a cell name declaration, variable declarations, an I/O path list, model logic, and timing checks. Each of these sections within the cell definition may be conveniently delimited by a syntax using selected keywords.

In this example, each section of the model source file 102 is introduced by a delimiter symbol, for example, "$", followed by a keyword. Each section is terminated by another delimiter symbol followed by a specific keyword that defines the end of the section or the beginning of a new section of the model source file 102. Basic file syntax conventions used to illustrate this example also include angle brackets "< >" to indicate input provided by the model developer specifically for the cell being modeled. Square brackets "[ ]" indicate input that may optionally be provided. A series of three dots " . . . " indicate input that may be repeated indefinitely. A single input required from a list of multiple choices is indicated by "(|)" where each item is separated from the preceding item by the vertical bar.

An example of a syntax for the cell name declaration is illustrated below in Table 1.

TABLE 1

(Copyright 2000, LSI Logic, Inc.)

//Copyright 2000, LSI Logic, Inc.
$cell <CELL NAME> [<CELL NAME> ...]

More than one cell name for the same model source file may be provided by the model developer. For each cell name, a standard cell model library 110 may be generated as output named <CELL NAME>.v in, for example, Verilog hardware description language (HDL). By using different names for the same model source file input, models for multiple versions of the same cell having identical functionality but different timing characteristics may be efficiently maintained. Also, decoupling the model functionality from the specifics of the timing characteristics supports the development of evolving and multiple ASIC manufacturing technologies with a single set of well tested, robust, source code. The cell name declaration is terminated by the variable declarations section.

The variable declarations section may be introduced by the keyword "$declare" and terminated by the keyword "$enddecl". The definitions within the section follow the syntax required by the standard library format used. In this example, the standard library format used is Verilog format. An example of a syntax for the variable declarations is illustrated below in Table 2.

TABLE 2

(Copyright 2000, LSI Logic, Inc.)

//Copyright 2000, LSI Logic, Inc.
$declare
<VERILOG SYNTAX VARIABLE/REGISTER/WIRE STATEMENTS>
$enddecl The I/O path section may be introduced by one of the following keywords, depending on the desired output: "$autopaths", to indicate that the I/O paths are to be automatically generated, "$nopaths", to indicate that the I/O path section is to be omitted entirely from the standard cell model library 110, or "$pathlist" to indicate a list of specific I/O paths to be generated. Other keywords may be used in a similar manner to suit specific applications. An example for the syntax for a list of specific I/O paths to be generated using the "$pathlist" keyword is illustrated below in Table 3.

TABLE 3

(Copyright 2000, LSI Logic, Inc.)

//Copyright 2000, LSI Logic, Inc.
$pathlist
$pin_pair <INPUT PIN NAME> <OUTPUT PIN NAME>
$path <VERILOG INPUT TO OUTPUT SPECIFICATION> =
(rise|fall|gotoz|<CONSTANT>)[,(rise|fall|gotoz|<CONSTANT>>)...];
[$parenpatch]
[
    $pin_pair <INPUT PIN NAME> <OUTPUT PIN NAME>
$path <VERILOG INPUT TO OUTPUT SPECIFICATION> =
(rise|fall|gotoz|<CONSTANT>)[,(rise|fall|gotoz|<CONSTANT>>)...];
[$parenpatch]
...]
$endpaths The input and output pins in the "$pin_pair" specifier determine which timing data will be used for the I/O path delay calculations. The keywords "rise", "fall", and "gotoz" determine which timing data will occupy those positions of the output I/O path delay in the standard model library 110. The Verilog format standard allows up to six delays to be specified. The "<CONSTANT>" option allows the model developer to use a constant for the timing value instead of the one calculated from the timing characterization data in the technology data file 104. A sample I/O path list using the syntax defined above is illustrated below in Table 4.

TABLE 4

(Copyright 2000, LSI Logic, Inc.)

//Copyright 2000, LSI Logic, Inc.
$pathlist
$pin_pair A Z
$path (A *> Z) = rise, fall;
$pin_pair B Z
$parenpatch
$path (B *> Z) = rise, fall;
$endpaths The example illustrated in Table 4 generates I/O path statements in the standard model library 110 specify block for the I/O paths "A to Z" and "B to Z". The specify block is a section of a Verilog HDL model that contains timing information specifications.

The "$parenpatch" keyword in the I/O path "$pin_pair" context may be used to indicate that default delays for the I/O path should default to zero rather than the library default of 100 ns.

The cell list data file 106, or model logic section, contains the behavioral code to be output in the standard model library 110. This code is created by the model designer based on the desired functional behavior of the cell being modeled and is placed appropriately in the standard model library 110. An example of the syntax, for the model logic section is illustrated below in Table 5.

TABLE 5

(Copyright 2000, LSI Logic, Inc.)

//Copyright 2000, LSI Logic, Inc.
$logic
<VERILOG STATEMENTS>
$endlogic

An example of behavioral code for cell list data file 106 is illustrated below in Table 6.

TABLE 6

(Copyright 2000, LSI Logic, Inc.)

//Copyright 2000, LSI Logic, Inc.
$logic
    parameter CMOS_TO_TTL = 0;
    parameter CLOAD$Z = 0;
    buf #(0.01) (Z, ZT);
    and (ZT, A, B);
$endlogic The timing checks section specifies the timing checks that are to be inserted in the standard cell model library 110. Timing checks in a verilog HDL model ensure that the timing of incoming signals conforms to certain relationships required for the circuit to function as intended. A list of timing checks may be introduced, for example, by the "$tchks" keyword and followed by single line statements indicating which timing checks are to appear in the model.

A table of keywords for the timing checks section is illustrated below in Table 7.

TABLE 7

(Copyright 2000, LSI Logic, Inc.)

| KEYWORD | FUNCTION |
|---|---|
| setuphold | combined setup and hold check |
| simrs | simultaneous set/reset |
| setup | data setup check |
| skew | clock skew check |
| recrem | combined reset recovery and removal check |
| hold | data hold check |
| mpwl | clock minimum pulse width low |
| mpwh | clock minimum pulse width high |
| recovery | reset recovery check |
| removal | reset removal check |

Some timing checks may have a data pin and a control pin; other checks may have only a control pin, for example, "mpwl" and "mpwh". An optional active edge type may be specified before each pin name. An exemplary list of active edge types are illustrated below in Table 8.

TABLE 8

(Copyright 2000, LSI Logic, Inc.)

| KEYWORD | DESCRIPTION |
|---|---|
| rise | generic rising edge |
| fall | generic falling edge |
| edge [01] | signal transition from 0 to 1 |
| edge [10] | signal transition from 1 to 0 |
| edge [x1] | signal transition from unknown to 1 |
| edge [x0] | signal transition from unknown to 0 |
| edge [0x] | signal transition from 0 to unknown |
| edge [1x] | signal transition from 1 to unknown |

Each pin may have an optional enabling condition to indicate that the check is to be executed only when the condition is true. Conditions may be identified, for example, by the keywords "enable1" for conditions that apply to a first pin or "enable2" for conditions that apply to a second pin. The condition itself may be specified between parentheses using standard Verilog hardware description language (HDL) for the logical condition syntax.

For example, to specify a condition on pin1 of a timing check statement in the model source file 102 where a pin named "RESET" must be equal to "0", the statement illustrated below in Table 9 may be used.

TABLE 9

(Copyright 2000, LSI Logic, Inc.)

//Copyright 2000, LSI Logic, Inc.
enable1 (RESET==1)

An optional timing check notifier may be used to name the signal to be placed in the timing check section of the standard cell model library 110 to be toggled (change state) upon violation of the timing check. The timing check notifier syntax is the keyword "notify" followed by the signal name.

An example of a formal syntax description for the timing check section described above is illustrated below in Table 10.

TABLE 10

(Copyright 2000, LSI Logic, Inc.)

```
//Copyright 2000, LSI Logic, Inc.
$tchks
{tchk_line}
[{tchk_line}...]
{tchk_line} =
{2pin_tchk_type}[{edge}] [{enable_1}] <PIN1> [{edge}] [enable_2] <PIN2>
    [notify <IDENTIFIER>]|
{1pin_tchk_type}[{edge}] [{enable_1}] <PIN1> [notify <IDENTIFIER>]
{2pin_tchk_type} = (setuphold | simrs | recrem | setup | hold | recovery | removal | skew)]
{1pin_tchk_type} = mpwl | mpwh)
(edge} = {rise | fall | edge[01] | edge[10] | edge[0x] | edge[1x] | edge[x1] | edge[x0]}
{enable_1} = enable1 (<CONDITION>)
{enable_2} = enable2 (<CONDITION)
```

An example of a timing checks section for a model source file 102 using the syntax of Table 10 is illustrated below in Table 11.

TABLE 11

(Copyright 2000, LSI Logic, Inc.)

```
//Copyright 2000, LSI Logic, Inc.
$tchks
setuphold D rise CP rise notify notifier1
setuphold D fall CP rise notify notifier1
setuphold SI rise SCK rise notify notifier2
setuphold SI fall SCK rise notify notifier2
mpwh CP notify notifier3
mpwl CP notify notifier3
mpwh SCK notify notifier4
mpwh SCK notify notifier4
```

An example of a model source file 102 for a complete cell definition is illustrated below in Table 12.

TABLE 12

(Copyright 2000, LSI Logic, Inc.)

```
//Copyright 2000, LSI Logic, Inc.
$cell FD2QAFP FD2QCFP
$declare
```

TABLE 12-continued (Copyright 2000, LSI Logic, Inc.)

```
    reg notifier1, notifier2, notifier3;
    wire DD, DCP, DCD;
$enddecl
$pathlist
$pin_pair CP Q
$path if (CD) (posedge CP => (Q +: D)) = rise, fall;
$pin_pair CD Q
$parenpatch
$path (negedge CD => (Q +: 1'b0)) = rise, fall;
$endpaths
$logic
    buf #(0.001) (Q, QT);
    LSI_UDP_DFFRP #(0.001) upd1 (QT, DCD, DD, DDCP,
    GO_TO_X);
//These resolve timing checks to avoid outputting X's if possible
    LSI_UDP_MPW_VIOL upd2 (MPW_VIOL_OK, DCD, DD,
    DDCP, QT);
    LSI_UDP_RESET_REC_VIOL upd3 (TREC_VIOL_OK, DD, CP);
    LSI_UDP_MANAGE_VIOL_R upd4 (GO_TO_X, notifier1,
    notifier3, MPW_VIOL_OK,
    notifier2, TREC_VIOL_OK);
    buf #(0.00) (DDCP, DCP);
$endlogic
$tchks
    setuphold D rise CP rise notify notifier1 tcheckcond DCD
    setuphold D fall CP rise notify notifier1 tcheckcond DCD
    recrem CD rise CP rise notify notifier2
    mpwh CP enable1 (DCD==1) notify notifier3
    mpwl CP enable1 (DCD==1) notify notifier3
    mpwl CD notify notifier3
```

The technology data file 104 is typically generated in binary format from a source text file developed by a circuit design engineer. The technology data file 104 describes the timing and electrical parasitic specifics of the circuit being modeled for a specific manufacturing technology.

The cell list data file 106 is created by a model developer from the functional specification of the circuit being modeled and contains a list of the cells in the library that are to be generated to construct the circuit being modeled. If an entire cell library is to be reconstructed, the name of every cell in the library may be included in the cell list data file 106. On the other hand, if the model developer is updating a single cell model to correct a specific problem, the cell list data file 106 may contain only the name of the single cell model. The cell list data file 106 thus allows changing or updating only selected cells without having to rebuild other models that may be included in the model source file 102 but have not changed, thereby conserving computer resources and reducing the simulation cycle time and the time-to-market. An example of a cell list data file 106 is illustrated below in Table 13.

TABLE 13

```
AND2A
AND2B
NOR2A
. . .
```

The standard cell library generator 108 receives as input the model source file 102, the technology dependent file 104, and the cell list data file 106 and generates as output the standard cell model library 110 from the parameterized timing data. The standard model library 110 in this example is a description file in the Verilog hardware description language format (HDL), although other description formats may be used to suit specific applications. The standard model library 110 accurately represents circuit timing information and completely describes the behavior of the circuit for any input within a specified range. An example of a standard cell model library 110 output in Verilog format named FD2QAFP.v is illustrated below in Table 14 for the sample model source file 102 illustrated above in Table 12.

TABLE 14

(Copyright 2000, LSI Logic, Inc.)

```
//Copyright 2000, LSI Logic, Inc.
// cell model header
'resetall
'ifdef resol_10ps
'timescale 1 ns/10 ps
'else
'timescale 1 ns/1 ps
'endif
'celldefine
// module declarations section
module FD2QAFP(Q,D,CP, CD);
    output Q;
    input D, CP, CD;
// pin list
    reg notifier1, notifier2, notifier3;
    wire DD, DCP, DCD;
    buf #(0.001) (Q, QT);
// functional code description
    LSI_UDP_DFFRP #(0.001) upd1 (QT, DCD, DD, DDCP GO_TO_X);
//      These resolve timing checks to avoid outputting X's if possible
    LSI_UDP_MPW_VIOL upd2 (MPW_VIOL_OK, DCD, DD, DDCP, QT);
    LSI_UDP_RESET_REC_VIOL upd3 (TREC_VIOL_OK, DD, CP);
    LSI_UDP_MANAGE_VIOL_R upd4 (GO_TO_X, notifier1, notifier3, MPW_VIOL_OK,
    notifier2, TREC_VIOL_OK);
    buf #(0.00) (DDCP, DCP);
// specify block
    specify
'ifdef approximate
    if (CD) (posedge CP => (Q +: D)) = (0.1236:0.1236:0.1236, 0.1584:0.1584:0:1584);
    (negedge CD => (Q +: 1'b0)) = (0.0726:0.0726:0.0726, 0.0726:0.0726:0.0726);
```

TABLE 14-continued (Copyright 2000, LSI Logic, Inc.)

```
`else
    if (CD) (posedge CP => (Q +: D)) = (100:100:100, 100:100:100);
    (negedge CD => (Q +: 1'b0)) = (0:0:0, 0:0:0);
`endif
`ifdef approximate
    $setuphold (posedge CP, posedge D, 0.2069:0.2069:0.2069, 0.1444:0.1444:0.1444,
notifier1, , DCD, DCP, DD);
    $setuphold (posedge CP, negedge D, 0.2069:0.2069:0.2069, 0.1444:0.1444:0.1444,
notifier1, , DCD, DCP, DD);
    $recrem (posedge CD, posedge CP, 0.0975:0.0975:0.0975, 0.2616:0.2616:0.2616,
notifier2, , DCD, DCP);
        $width (posedge CP &&& (DCD==1), 0.0547:0.0547:0.0547, 0, notifier3);
        $width (negedge CP &&& (DCD==1), 0.938:0.0938:0.0938, 0, notifier3);
        $width (negedge CD, 0.1016:0.1016:0.1016, 0, notifier3)
`else
    $setuphold (posedge CP, posedge D,100.0000:100.0000:100.0000,
100.0000:100.0000:100.0000, notifier1, , DCD, DCP, DD);
    $setuphold (posedge CP, negedge D,100.0000:100.0000:100.0000,
100.0000:100.0000:100.0000, notifier1, , DCD, DCP, DD);
    $recrem (posedge CD, posedge CP, 100.0000:100.0000:100.0000,
100.0000:100.0000:100.0000, notifier2, , DCD, DCP);
        $width (posedge CP &&& (DCD==1), 100.0000:100.0000:100.0000, 0, notifier3);
        $width (negedge CP &&& (DCD==1), 100.0000:100.0000:100.0000, 0, notifier3);
        $width (negedge CD, 100.0000:100.0000:100.0000, 0, notifier3);
`endif //approximate
    endspecify
// cell model trailer
endmodule
`endcelldefine
```

The ASIC design environment 112 provides a suite of design tools for simulating the operation of a proposed design using the standard cell model library 110 generated in step 108. A commercially available example of an ASIC design environment is the FlexStream Design System available from LSI Logic, Inc.

FIG. 2 is a more detailed flowchart 200 of the standard cell model library generator 108 in FIG. 1.

Step 202 is the entry point for the flowchart 200.

Step 204 receives as input the model source file 102, the technology data file 104, and the cell list data file 106.

Step 206 parses a functional description for each cell in the cell list data file 106 from the model source file 102. The parsing may be performed by, for example, the Lex/YaCC parser, available from the Free Software Foundation, Boston, Mass.

Step 208 expands parameterized timing data for each cell in the cell list data file 102 from the technology dependent file 104 by assuming typical operating conditions of voltage and temperature and calculating delays that approximate the timing of each cell.

Step 210 generates as output the standard cell model library 110 from the expanded parameterized timing data by inserting the calculated delays in the appropriate I/O path or timing construct specified by the model source file 102.

Step 212 is the exit point for the flowchart 200.

FIG. 3 is a more detailed flowchart 300 of step 206 in FIG. 2.

Step 302 is the entry point for the flowchart 300.

Step 304 comprises identifying cell functional information, i.e., the functional code shown in the declarations section in the example of Table 12.

Step 306 identifies explanatory comments that are preceded by "//" (double slash).

Step 308 identifies parameterized input/output path delay information shown in the pathlist section in the example of Table 12.

Step 310 identifies timing check data shown in the timing checks section in the example of Table 12.

Step 312 is the exit point for the flowchart 300.

FIG. 4 is a more detailed flowchart 400 of step 208 of expanding the parameterized timing data in FIG. 2.

Step 402 is the entry point for the flowchart 400.

Step 404 creates an input/output path data structure for each timing path for each cell in the cell list data file 106. Data structures may be created according to well known computer programming techniques.

Step 406 inserts pin information and delay conditions in the input/output path data structure for each timing path for each cell in the cell list data file.

Step 408 calculates approximate input/output path timing values for each timing path for each cell in the cell list data file and inserts the approximate input/output path timing values into the input/output path data structure.

Step 410 creates a timing check data structure for each timing check for each cell in the cell list data file.

Step 412 inserts pin information, timing check type, and timing check conditions into the timing check data structure.

Step 414 calculates approximate timing check values and inserts the approximate timing check values into the timing check data structure.

Step 416 is the exit point for the flowchart 400.

FIG. 5 is a more detailed flowchart 500 of step 210 of generating as output the standard cell model library 110 exemplified by Table 14.

Step 502 is the entry point for the flowchart 500.

Step 504 generates a cell model header.

Step 506 generates a module declaration.

Step 508 generates a pin list.

Step 510 generates a functional code description.

Step 512 generates a specify block.

Step 514 generates a cell model trailer.

Step 516 is the exit point for the flowchart 500.

When all the outputs for the standard cell model library 110 are generated, the standard cell model library 110 may be subjected to design system regression testing. In design system regression testing, a test bench is created for each cell to verify that the simulation model behaves in the same way as the actual circuit. Once the standard cell model library 110 passes the regression testing, it may be integrated into a verified design system. When all components of the design system have been verified, the design system may be released for use in application-specific integrated circuit (ASIC) chip design. Step 516 is the exit point for the flowchart 500.

The method for generating a cell timing model library in a standard library format described above provides the capability to rapidly retarget existing functional cell model development work to new ASIC technologies, to support multiple ASIC technologies concurrently, to avoid redundant design effort from one release to another, to update cell models frequently and rapidly as improved technology characterization data is developed, and to retarget the standard library file generator to adapt to system-wide design model strategy changes, while ensuring that parameters in third party model libraries are complete and are calculated consistently and accurately.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of generating a cell function and timing model library in a standard library format comprising the steps of:
    (a) receiving as input a model source file, a technology dependent file, and a cell list data file;
    (b) parsing a functional description for each cell in the cell list data file from the model source file;
    (c) expanding parameterized timing data for each cell in the cell list data file from the technology dependent file; and
    (d) generating as output a standard cell model library from the parameterized timing data.

2. The method of claim 1 further comprising after step (d) the step (e) of subjecting the cell model library to design system regression testing.

3. The method of claim 2 further comprising after step (e) the step (f) of integrating the standard cell model library into a verified design system.

4. The method of claim 1 wherein step (b) comprises identifying functional information.

5. The method of claim 1 wherein step (b) comprises identifying comment information.

6. The method of claim 1 wherein step (b) comprises identifying parameterized input/output path delay information.

7. The method of claim 1 wherein step (b) comprises identifying timing checks.

8. The method of claim 1 wherein step (c) comprises creating an input/output path data structure for each timing path for each cell in the cell list data file.

9. The method of claim 1 wherein step (c) comprises inserting pin information and delay conditions in the input/output path data structure for each timing path for each cell in the cell list data file.

10. The method of claim 1 wherein step (c) comprises calculating approximate input/output path timing values for each timing path for each cell in the cell list data file and inserting the approximate input/output path timing values into the input/output path data structure.

11. The method of claim 1 wherein step (c) comprises creating a timing check data structure for each timing check for each cell in the cell list data file.

12. The method of claim 1 wherein step (c) comprises inserting pin information, timing check type, and timing check conditions into the timing check data structure.

13. The method of claim 1 wherein step (c) comprises calculating approximate timing check values and inserting the approximate timing check values into the timing check data structure.

14. The method of claim 1 wherein step (d) comprises generating a cell model header.

15. The method of claim 1 wherein step (d) comprises generating a module declaration.

16. The method of claim 1 wherein step (d) comprises generating a pin list.

17. The method of claim 1 wherein step (d) comprises generating a specify block.

18. The method of claim 1 wherein step (d) comprises generating a functional code description.

19. The method of claim 1 wherein step (d) comprises generating a cell model trailer.

\* \* \* \* \*